United States Patent [19]  
Magid et al.

[11] Patent Number: 5,035,831  
[45] Date of Patent: Jul. 30, 1991

[54] AZEOTROPE-LIKE COMPOSITIONS OF 1,1,2-TRICHLORO-1,2,2-TRIFLUOROETHANE, NITROMETHANE, 1,2-DICHLOROETHYLENE, AND ETHANOL OR ISOPROPANOL

[75] Inventors: Hillel Magid; Ian R. Shankland; David P. Wilson, all of Williamsville; Kane D. Cook, Buffalo; Earl A. E. Lund, West Seneca, all of N.Y.

[73] Assignee: Allied-Signal Inc., Morris Township, N.J.

[21] Appl. No.: 417,991

[22] Filed: Oct. 6, 1989

[51] Int. Cl.$^5$ .................. C11N 7/30; C11N 7/50; C23G 5/028
[52] U.S. Cl. ..................... 252/171; 134/12; 134/38; 134/39; 134/40; 203/67; 252/153; 252/162; 252/170; 252/172; 252/364; 252/DIG. 9
[58] Field of Search ............... 252/153, 162, 170, 171, 252/172, 364, DIG. 9; 134/12, 38, 39, 40; 203/67

[56] References Cited

U.S. PATENT DOCUMENTS

| | | | |
|---|---|---|---|
| 3,340,199 | 9/1967 | Clay | 252/171 |
| 3,455,835 | 7/1969 | Burt | 252/172 |
| 3,573,213 | 3/1971 | Burt | 252/172 |
| 3,789,006 | 1/1974 | McMillan et al. | 252/171 |
| 3,903,009 | 9/1975 | Baver et al. | 252/171 |
| 4,767,561 | 8/1988 | Gorski | 252/171 |
| 4,803,009 | 2/1989 | Gorski | 252/171 |
| 4,804,493 | 2/1989 | Gorski | 252/171 |
| 4,877,545 | 10/1989 | Merchant | 252/171 |
| 4,904,407 | 2/1990 | Swan | 252/171 |
| 4,936,923 | 6/1990 | Merchant et al. | 252/171 |
| 4,961,870 | 10/1990 | Cook et al. | 252/171 |

FOREIGN PATENT DOCUMENTS 126376 7/1985 Japan .

OTHER PUBLICATIONS

L. H. Horsley, in Advance in Chemistry Series, No. 35, Azeotropic Data II 25 (1962).

Primary Examiner—Paul Lieberman  
Assistant Examiner—Linda D. Skaling  
Attorney, Agent, or Firm—Colleen D. Szuch; Jay P. Friedenson

[57] ABSTRACT

Stable azeotrope-like compositions of 1,1,2-trichloro-1,2,2-trifluoroethane, nitromethane, 1,2-dichloroethylene and an alkanol which are useful in a variety of industrial cleaning applications.

15 Claims, No Drawings

AZEOTROPE-LIKE COMPOSITIONS OF 1,1,2-TRICHLORO-1,2,2-TRIFLUOROETHANE, NITROMETHANE, 1,2-DICHLOROETHYLENE, AND ETHANOL OR ISOPROPANOL

FIELD OF THE INVENTION

This invention relates to azeotrope-like mixtures of 1,1,2-trichloro-1,2,2-trifluoroethane, nitromethane, 1,2-dichloroethylene and an alkanol. These mixtures are useful in a variety of vapor degreasing applications and as solvents in a variety of industrial cleaning applications including defluxing of printed circuit boards.

BACKGROUND OF THE INVENTION

Fluorocarbon based solvents have been used extensively for the degreasing and otherwise cleaning of solid surfaces, especially intricate parts and difficult to remove soils.

In its simplest form, vapor degreasing or solvent cleaning consists of exposing a room-temperature object to be cleaned to the vapors of a boiling solvent. Vapors condensing on the object provide clean distilled solvent to wash away grease or other contamination. Final evaporation of solvent from the object leaves the object free of residue. This is contrasted with liquid solvents which leave a residue on the object after rinsing.

A vapor degreaser is used for difficult to remove soils where elevated temperature is necessary to improve the cleaning action of the solvent, or for large volume assembly line operations where the cleaning of metal parts and assemblies must be done efficiently. The conventional operation of a vapor degreaser consists of immersing the part to be cleaned in a sump of boiling solvent which removes the bulk of the soil, thereafter immersing the part in a sump containing freshly distilled solvent near room temperature, and finally exposing the part to solvent vapors over the boiling sump which condense on the cleaned part. In addition, the part can also be sprayed with distilled solvent before final rinsing.

Vapor degreasers suitable in the above-described operations are well known in the art. For example, Sherliker et al. in U.S. Pat. No. 3,085,918 disclose such suitable vapor degreasers comprising a boiling sump, a clean sump, a water separator, and other ancillary equipment.

Recently, nontoxic nonflammable fluorocarbon solvents like trichlorotrifluoroethane have been used extensively in degreasing applications and other solvent cleaning applications. Trichlorotrifluoroethane has been found to have satisfactory solvent power for greases, oils, waxes, and the like. It has therefore found widespread use for cleaning electric motors, compressors, heavy metal parts, delicate precision metal parts, printed circuit boards, gyroscopes, guidance systems, aerospace and missile hardware, aluminum parts, etc.

The art has looked towards azeotropic compositions having fluorocarbon components because the fluorocarbon components contribute additionally desired characteristics, such as polar functionality, increased solvency power, and stabilizers. Azeotropic compositions are desired because they exhibit a minimum boiling point and do not fractionate upon boiling. This is desirable because in the previously described vapor degreasing equipment with which these solvents are employed, redistilled material is generated for final rinse-cleaning. Thus, the vapor degreasing system acts as a still. Therefore, unless the solvent composition is essentially constant boiling, fractionation will occur and undesirable solvent distribution may act to upset the cleaning and safety of processing. For example, preferential evaporation of the more volatile components of the solvent mixtures would result in mixtures with changed compositions which may have less desirable properties, such as lower solvency toward soils, less inertness towards metal, plastic or elastomer components, and increased flammability and toxicity.

A number of 1,1,2-trichloro-1,2,2-trifluoroethane based azeotrope compositions have been discovered which have been tested and in some cases employed as solvents for miscellaneous vapor degreasing and defluxing applications. For example, U.S. Pat. No. 3,573,213 discloses the azeotrope of 1,1,2-trichloro-1,2,2-trifluoroethane and nitromethane; U.S. Pat. No. 3,340,199 discloses an azeotropic composition of 1,1,2-trichloro-1,2,2-trifluoroethane and isopropanol; U.S. Pat. No. 3,789,006 discloses azeotropic mixtures of 1,1,2-trichloro-1,2,2-trifluoroethane, isopropanol, and nitromethane; U.S. Pat. No. 3,455,835 discloses azeotrope-like compositions of 1,1,2-trichloro-1,2,2-trifluoroethane and trans-1,2-dichloroethylene; U.S. Pat. No. 4,767,561 discloses azeotrope-like compositions containing 1,1,2-trichloro-1,2,2-trifluoroethane, isopropanol, and trans-1,2-dichloroethylene; U.S. Pat. No. 3,903,009 discloses an azeotropic composition of 1,1,2-trichloro-1,2,2-trifluoroethane, ethanol, and nitromethane; and L. H. Horsley, in Advances in Chemistry Series, No. 35, Azeotropic Data II, 25 (1962), discloses an azeotropic composition of 1,1,2-trichloro-1,2,2-trifluoroethane and ethanol.

The art is continually seeking new fluorocarbon based azeotropic mixtures which offer alternatives for new and special applications for vapor degreasing and other industrial cleaning applications.

Accordingly, it is an object of this invention to provide novel azeotrope-like compositions based on 1,1,2-trichloro-1,2,2-trifluoroethane which have good solvency power and other desirable properties for vapor degreasing and other solvent cleaning applications.

Another object of the invention is to provide novel constant boiling or essentially constant boiling solvents which, in addition to having the foregoing advantages, are liquid at room temperature and non-fractionating.

A further object of the invention is to provide azeotrope-like compositions which are nonflammable in both the liquid and vapor phases. These and other objects and features of the invention will become apparent from the description which follows.

SUMMARY OF THE INVENTION

The invention relates to novel azeotrope-like compositions which are useful in a variety of industrial cleaning applications. Specifically the invention relates to compositions of 1,1,2-trichloro-1,2,2,-trifluoroethane, nitromethane, 1,2-dichloroethylene, and an alkanol which are essentially constant boiling, non-fractionating, non-flammable in both the liquid and vapor phases, possess good solvency power, and remain liquid at room temperature.

DETAILED DESCRIPTION OF THE INVENTION

In accordance with the invention, novel azeotrope-like compositions have been discovered comprising 1,1,2-trichloro-1,2,2-trifluoroethane, nitromethane, 1,2-dichloroethylene, and an alkanol.

1,2-Dichloroethylene exists in two isomeric forms, trans-1,2-dichloroethylene and cis-1,2-dichloroethylene. Each isomer, as well as mixtures of the isomers, form azeotrope-like compositions with 1,1,2-trichloro-1,2,2-trifluoroethane, nitromethane and an alkanol. Hence, for purposes of this invention, 1,2-dichloroethylene may consist of either isomer or a mixture of the isomers in any proportion. For example, trans-1,2-dichloroethylene is often provided as a mixture containing up to about 5 weight percent cis-1,2-dichloroethylene.

The alkanol component of the invention may consist of either ethanol or isopropanol. Each forms an azeotrope-like composition when combined with 1,1,2-trichloro-1,2,2-trifluoroethane, nitromethane, and 1,2-dichloroethylene.

Trans-1,2-dichloroethylene is the preferred isomer in accordance with the invention. With respect to the preferred embodiment, when isopropanol is used, the azeotrope-like compositions comprise from about 62.8 to about 68.4 weight percent 1,1,2-trichloro-1,2,2-trifluoroethane, from about 1.0 to about 3.0 weight percent isopropanol, from about 0.01 to about 1.0 weight percent nitromethane, and from about 30.0 to about 36.0 weight percent trans-1,2-dichloroethylene. These compositions boil at about 43.6° C. at 760 mm Hg.

When ethanol is the alkanol component of the mixture, the preferred embodiment comprises from about 61.4 to about 71.8 weight percent 1,1,2-trichloro-1,2,2-trifluoroethane, from about 1.0 to about 5.0 weight percent ethanol, from about 0.01 to about 0.6 weight percent nitromethane, and from about 27.0 to about 36.0 weight percent trans-1,2-dichloroethylene. These compositions boil at about 42.4° C. at 760 mm Hg.

It is more preferable that the azeotrope-like compositions containing the trans- isomer of 1,2-dichloroethylene and isopropanol comprise from about 63.0 to about 67.5 weight percent 1,1,2-trichloro-1,2,2-trifluoroethane, from about 1.2 to about 2.8 weight percent isopropanol, from about 0.01 to about 0.6 weight percent nitromethane, and from about 31.0 to about 35.0 weight percent trans-1,2-dichloroethylene. These compositions boil at about 43.6° C at 760 mm Hg.

When ethanol is used, it is more preferable that the azeotrope-like compositions containing the trans-isomer comprise from about 63.0 to about 70.0 weight percent of 1,1,2-trichloro-1,2,2-trifluoroethane, from about 2.0 to about 4.2 weight percent ethanol, from about 0.01 to about 0.6 weight percent nitromethane, and from about 28.0 to about 34.0 weight percent trans-1,2-dichloroethylene. These compositions boil at about 42.4° C. at 760 mm Hg.

The most preferred azeotrope-like compositions containing trans-1,2-dichloroethylene and isopropanol contain from about 63.5 to about 67.0 weight percent 1,1,2-trichloro-1,2,2-trifluoroethane, from about 1.4 to about 2.6 weight percent isopropanol, from about 0.01 to about 0.6 weight percent nitromethane and from about 31.5 to about 34.5 weight percent trans-1,2-dichloroethylene. These compositions boil at approximately 43.6° C. at 760 mm Hg.

The most preferred azeotrope-like composition containing trans-1,2-dichloroethylene and ethanol contain from about 63.5 to about 68.0 weight percent 1,1,2-trichloro-1,2,2-trifluoroethane, from about 2.5 to about 4.0 weight percent ethanol, from about 0.01 to about 0.6 weight percent nitromethane, and from about 29.5 to about 32.5 weight percent trans-1,2,-dichloroethylene. These compositions boil at approximately 42.4° C. at 760 mm Hg.

In another embodiment of the invention, inhibitors may be added to the azeotropic mixtures to inhibit decomposition of the solvent; react with undesirable decomposition products of the solvent; and/or prevent corrosion of metal surfaces. Any or all of the following classes of inhibitors may be employed in the invention: epoxy compounds, e.g., propylene oxide; ethers, e.g., 1-4-dioxane; unsaturated compounds, e.g., 1,4-butyne diol; acetals or ketals, e.g., dipropoxy methane; ketones, e.g., methyl ethyl ketone; alcohols, e.g., tertiary amyl alcohol; esters, e.g., triphenyl phosphite; and amines, e.g., triethyl amine. Other suitable inhibitors will readily occur to those skilled in the art.

The precise azeotrope compositions in accordance with the invention have not been determined but have been ascertained to be within the above ranges. Regardless of where the true azeotrope lie, all compositions within the indicated ranges, as well as, certain compositions outside the indicated ranges, are azeotrope-like, as defined more particularly below.

It has been found that these azeotrope-like compositions are stable, safe to use, and exhibit excellent solvency power. These compositions have been found to be particularly effective when employed in conventional degreasing units for the dissolution of rosin fluxes and the cleaning of such fluxes from printed circuit boards.

From fundamental principles, the thermodynamic state of a system (pure fluid or mixture) is defined by four variables: pressure, temperature, liquid compositions and vapor compositions, or P-T-X-Y, respectively. An azeotrope is a unique characteristic of a system of two or more components where X and Y are equal at a stated p and T. In practice, this means that the components of a mixture cannot be separated during distillation or in vapor phase solvent cleaning when that distillation is carried out at a fixed T (the boiling point of the mixture) and a fixed P (atmospheric pressure).

For the purpose of this discussion, by azeotrope-like composition is intended to mean that the composition behaves like a true azeotrope in terms of its constant boiling characteristics or tendency not to fractionate upon boiling or evaporation. Such composition may or may not be a true azeotrope. Thus, in such compositions, the composition of the vapor formed during boiling or evaporation is identical or substantially identical to the original liquid composition. Hence, during boiling or evaporation, the liquid composition, if it changes at all, changes only slightly. This is contrasted with non-azeotrope-like compositions in which the liquid composition changes substantially during boiling or evaporation.

Thus, in order to determine whether a candidate mixture is "azeotrope-like" within the meaning of this invention, one only has to distill a sample thereof under conditions (i.e., resolution—number of plates) which would be expected to separate the mixture into its components. If the mixture is non-azeotrope or non-azeotrope-like, the mixture will fractionate, with the lowest boiling component distilling off first, etc. If the mixture is azeotrope-like, some finite amount of a first distillation cut will be obtained which contains all of the mixture components and which is constant boiling or behaves as a single substance. This phenomenon cannot occur if the mixture is not azeotrope-like, i.e., it is not part of an azeotropic system. If the degree of fractionation of the candidate mixture is unduly great, then a composition closer to the true azeotrope must be selected to minimize fractionation. Of course, upon distillation of an azeotrope-like composition such as in a vapor degreaser, the true azeotrope will form and tend to concentrate.

It follows from the above discussion that another characteristic of azeotrope-like compositions is that there is a range of compositions containing the same components in varying proportions which are azeotrope-like. All such compositions are intended to be covered by the term azeotrope-like as used herein. As an example, it is well known that at different pressures, the composition of a given azeotrope will vary at least slightly and that changes in distillation pressures also change the distillation temperatures at least slightly. Thus, an azeotrope of A and B represents a unique type of relationship but with a variable composition depending on temperature and/or pressure. Accordingly, another way of defining azeotrope-like within the meaning of this invention is to state that such mixtures boil within about ±1° C. (at 760 mm Hg) of the boiling point of the most preferred compositions disclosed herein i.e., 43.0° C. at 760 mm Hg.

The 1,1,2-trichloro-1,2,2-trifluoroethane, ethanol, isopropanol, nitromethane, and 1,2-dichloroethylene components of the novel solvent azeotrope-like compositions of the invention are all commercially available. Preferably they should be used in sufficiently high purity so as to avoid the introduction of adverse influences upon the solvent properties or constant boiling properties of the system. A suitable grade of 1,1,2-trichloro-1,2,2-trifluoroethane, for example, is sold by Allied-Signal Inc., under the trademark GENESOLV® D.

EXAMPLES 1-6

The azeotrope-like compositions of the invention were determined through the use of distillation techniques designed to provide higher rectification of the distillate than found in most vapor degreaser systems. For this purpose a five theoretical plate Oldershaw distillation column was used with a cold water condensed, automatic liquid dividing head. Typically, approximately 350 grams of liquid were charged to the distillation pot. In Examples 1-6, the liquid was a mixture of various combinations of 1,1,2-trichloro-1,2,2-trifluoroethane, isopropanol, nitromethane, and trans-1,2-dichloroethylene. The mixtures were heated at total reflux for about one hour to ensure equilibration. For most of the runs, the distillate was obtained using a 3:1 reflux ratio at a boil-up rate of 250-300 grams per hour. Approximately 150 grams of product were distilled and 4 approximately equivalent sized overhead cuts were collected. The vapor temperature (of the distillate), pot temperature, and barometric pressure were monitored. A constant boiling fraction was collected and analyzed by gas chromatography to determine the weight percentages of its components.

To normalize observed boiling points during different days to 760 millimeters of mercury pressure, the approximate normal boiling points of 1,1,2-trichloro-1,2,2-trifluoroethane (FC-113) rich mixtures were estimated by applying a barometric correction factor of about 26 mm Hg/° C., to the observed values. However, it is to be noted that this corrected boiling point is generally accurate up to ±0.4° C. and serves only as a rough comparison of boiling points determined on different days. By the above-described method, it was discovered that constant boiling mixtures were formed as indicated in the following Table. Supporting distillation data for the mixtures studied are shown in the Table.

TABLE I

| EXAMPLE | FC-113 | TRANS-1,2-DCE | ALKANOL | NITRO-METHANE |
|---|---|---|---|---|
| STARTING MATERIAL (WT. %) | | | | |
| 1 | 62.8 | 36.0 | 1.0 | 0.2 |
| 2 | 63.8 | 33.0 | 3.0 | 0.2 |
| 3 | 64.3 | 32.1 | 3.0 | 0.6 |
| 4 | 64.7 | 32.1 | 3.0 | 0.2 |
| 5 | 66.8 | 32.1 | 1.0 | 0.1 |
| 6 | 68.4 | 30.0 | 1.0 | 0.6 |
| CONSTANT BOILING FRACTION (WT. %) | | | | |
| 1 | 62.9 | 35.1 | 1.6 | 0.4 |
| 2 | 64.8 | 32.9 | 2.2 | 0.1 |
| 3 | 68.1 | 32.5 | 2.0 | 0.4 |
| 4 | 65.0 | 32.8 | 2.1 | 0.1 |
| 5 | 65.1 | 33.0 | 1.8 | 0.1 |
| 6 | 65.5 | 31.3 | 2.8 | 0.4 |

| EXAMPLES | VAPOR TEMP (°C.) | BAROMETRIC PRESSURE (mm Hg) | BOILING POINT CORRELATED TO 760 (°C.) mm Hg |
|---|---|---|---|
| 1 | 43.3 | 746.2 | 43.8 |
| 2 | 42.9 | 747.8 | 43.4 |
| 3 | 43.0 | 746.2 | 43.5 |
| 4 | 42.8 | 741.4 | 43.5 |
| 5 | 43.0 | 745.0 | 43.5 |
| 6 | 43.1 | 744.4 | 43.7 |
| | | | Mean: 43.6 ± 0.1 |

From the above examples, it is apparent that additional constant boiling or essentially constant boiling mixtures of the same components can readily be identified by anyone of ordinary skill in the art by the method described. No attempt was made to fully characterize and define the true azeotrope in the systems described above, nor the outer limits of the compositional ranges which are constant boiling. Anyone skilled in the art can readily ascertain other constant boiling or essentially constant boiling mixtures.

EXAMPLES 7-12

The azeotropic properties of 1,1,2-trichloro-1,2,2-trifluoroethane, isopropanol, nitromethane, and 95:5 trans-1,2-dichloroethylene/cis-1,2-dichloroethylene are studied by repeating the experiment outlined in Examples 1-6. The results obtained are substantially the same as those for 1,1,2-trichloro-1,2,2-trifluoroethane, isopropanol, nitromethane and trans-1,2-dichloroethylene, i.e., 1,1,2-trichloro-1,2,2-trifluoroethane, isopropanol, nitromethane and 95:5 trans-1,2-dichloro-ethylene/cis-1,2-dichloroethylene form an essentially constant boiling mixture.

EXAMPLES 13-18

The azeotropic properties of 1,1,2-trichloro-1,2,2-trifluoroethane, ethanol, nitromethane, and 95:5 trans-1,2-dichloroethylene/cis-1,2-dichloroethylene are studied by repeating the experiment outlined in Examples 1-6. The results obtained are substantially the same as those for 1,1,2-trichloro-1,2,2-trifluoroethane, isopropanol, nitromethane and trans-1,2-dichloroethylene, i.e., 1,1,2- trichloro-1,2,2-trifluoroethane, ethanol, nitromethane and 95:5 trans-1,2-dichloroethylene/cis-1,2-dichloroethylene form an essentially constant boiling mixture.

What is claimed is:

1. Azeotrope-like compositions consisting essentially of from about 62.8 to about 68.4 weight percent 1,1,2-trichloro-1,2,2-trifluoroethane, from about 1.0 to about 3.0 weight percent isopropanol, from about 0.01 to about 1.0 weight percent nitromethane, and from about 30.0 to about 36.0 weight percent trans-1,2-dichloroethylene which boil at about 43.6° C. at 760 mm Hg.

2. The azeotrope-like compositions of claim 1 wherein said compositions consist essentially of from about 63.0 to about 67.5 weight percent 1,1,2-trichloro-1,2,2-trifluoroethane, from about 1.2 to about 2.8 weight percent isopropanol, from about 0.01 to about 0.6 weight percent nitromethane, and from about 31.0 to about 35.0 weight percent trans-1,2-dichloroethylene.

3. The azeotrope-like compositions of claim 1 wherein said compositions consist essentially of from about 63.5 to about 67.0 weight percent 1,1,2-trichloro-1,2,2-trifluoroethane, from about 1.4 to about 2.6 weight percent isopropanol, from about 0.01 to about 0.6 weight percent nitromethane, and from about 31.5 to about 34.5 weight percent trans-1,2-dichloroethylene.

4. The azeotrope-like compositions of claim 1 wherein said compositions additionally include effective amounts of an inhibitor to inhibit decomposition of the solvent, react with undesirable decomposition products of the solvent and prevent corrosion of metal surfaces.

5. The azeotrope-like compositions of claim 4 wherein said inhibitor is selected from the group consisting of epoxy compounds, ethers, unsaturated compounds, acetals, ketals, ketones, tertiary amyl alcohol, esters, and amines.

6. A method of cleaning a solid surface comprising treating said surface with an azeotrope-like composition of claim 1.

7. Azeotrope-like compositions consisting essentially of from about 62.8 to about 68.4 weight percent 1,1,2-trichloro-1,2,2-trifluoroethane, from about 1.0 to about 3.0 weight percent isopropanol, from about 0.01 to about 1.0 weight percent nitromethane, and from about 30.0 to about 36.0 weight percent of a mixture of trans-1,2-dichloroethylene and cis-1,2-dichloroethylene wherein said cis-1,2-dichloroethylene is present in an amount of up to about 5 weight percent of said mixture which boil at about 43.6° C. at 760 mm Hg.

8. The azeotrope-like compositions of claim 7 wherein said compositions consist essentially of from about 63.0 to about 67.5 weight percent 1,1,2-trichloro-1,2,2-trifluoroethane, from about 1.2 to about 2.8 weight percent isopropanol, from about 0.01 to about 0.6 weight percent nitromethane, and from about 31.0 to about 35.0 weight percent of a mixture of trans-1,2-dichloroethylene and cis-1,2-dichloroethylene wherein said cis-1,2-dichloroethylene is present in an amount of up to about 5 weight percent of said mixture.

9. The azeotrope-like compositions of claim 7 wherein said compositions consist essentially of from about 63.5 to about 67.0 weight percent 1,1,2-trichloro-1,2,2-trifluoroethane, from about 1.4 to about 2.6 weight percent isopropanol, from about 0.01 to about 0.6 weight percent nitromethane, and from about 31.5 to about 34.5 weight percent of a mixture of trans-1,2-dichloroethylene and cis-1,2-dichloroethylene wherein said cis-1,2-dichloroethylene is present in an amount of up to about 5 weight percent of said mixture.

10. The azeotrope-like compositions of claim 7 wherein said mixture is about 95 weight percent trans-1,2-dichloroethylene and about 5 weight percent cis-1,2-dichloroethylene.

11. The azeotrope-like compositions of claim 8 wherein said mixture is about 95 weight percent trans-1,2-dichloroethylene and about 5 weight percent cis-1,2-dichloroethylene.

12. The azeotrope-like compositions of claim 9 wherein said mixture is about 95 weight percent trans-1,2-dichloroethylene and about 5 weight percent cis-1,2-dichloroethylene.

13. The azeotrope-like compositions of claim 7 wherein said composition additionally include effective amounts of an inhibitor to inhibit decomposition of the solvent, react with undesirable decomposition products of the solvent and prevent corrosion of metal surfaces.

14. The azeotrope-like compositions of claim 13 wherein said inhibitor is selected from the group consisting of epoxy compounds, ethers, unsaturated compounds, acetals, ketals, ketones, tertiary amyl alcohol esters, and amines.

15. A method of cleaning a solid surface comprising treating said surface with an azeotrope-like composition of claim 7.

* * * * *